(12) United States Patent
Matsukura et al.

(10) Patent No.: US 11,404,603 B2
(45) Date of Patent: Aug. 2, 2022

(54) NITRIDE SEMICONDUCTOR LIGHT-EMITTING ELEMENT

(71) Applicant: NIKKISO CO., LTD., Tokyo (JP)

(72) Inventors: Yusuke Matsukura, Ishikawa (JP); Tetsuhiko Inazu, Ishikawa (JP); Cyril Pernot, Ishikawa (JP)

(73) Assignee: Nikkiso Co., Ltd., Tokyo (JP)

(*) Notice: Subject to any disclaimer, the term of this patent is extended or adjusted under 35 U.S.C. 154(b) by 0 days.

(21) Appl. No.: 16/986,635

(22) Filed: Aug. 6, 2020

(65) Prior Publication Data
US 2021/0043802 A1    Feb. 11, 2021

(30) Foreign Application Priority Data
Aug. 6, 2019  (JP) .............................. JP2019-144676

(51) Int. Cl.
*H01L 33/14* (2010.01)
*H01L 33/32* (2010.01)
*H01L 33/06* (2010.01)
*H01L 33/00* (2010.01)

(52) U.S. Cl.
CPC ........ *H01L 33/145* (2013.01); *H01L 33/0025* (2013.01); *H01L 33/32* (2013.01); *H01L 33/06* (2013.01)

(58) Field of Classification Search
CPC .............. H01L 33/145; H01L 33/0025; H01L 33/32; H01L 33/06
See application file for complete search history.

(56) References Cited

U.S. PATENT DOCUMENTS

| | | | |
|---|---|---|---|
| 8,227,789 B2 * | 7/2012 | Hirayama | H01L 33/06 257/13 |
| 10,505,074 B2 | 12/2019 | Asada et al. | |
| 10,686,098 B2 | 6/2020 | Asada et al. | |
| 11,031,522 B2 * | 6/2021 | Kinoshita | H01L 33/0025 |

(Continued)

FOREIGN PATENT DOCUMENTS

| | | |
|---|---|---|
| CN | 103915534 A | 7/2014 |
| JP | 2011-187591 A | 9/2011 |

(Continued)

OTHER PUBLICATIONS

Japanese Office Action dated Nov. 15, 2019 issued in JP 2019-144676.
Japanese Office Action dated Feb. 8, 2022 issued in JP 2020-079137 together with English language translation.
Japanese Office Action dated Jun. 7, 2022 issued in JP 2020-079137 together with English language translation.

*Primary Examiner* — Mark W Tornow
(74) *Attorney, Agent, or Firm* — Scully, Scott, Murphy & Presser, PC (57) ABSTRACT

A nitride semiconductor light-emitting element includes an active layer including an AlGaN-based barrier layer, a p-type contact layer located on an upper side of the active layer, and an electron blocking stack body located between the active layer and the p-type contact layer. The electron blocking stack body includes a first electron blocking layer and a second electron blocking layer. The first electron blocking layer is located on the active layer side and has a higher Al composition ratio than an Al composition ratio in the barrier layer. The second electron blocking layer is located on the p-type contact layer side and has a lower Al composition ratio than an Al composition ratio in the barrier layer.

5 Claims, 6 Drawing Sheets

(56) References Cited

U.S. PATENT DOCUMENTS

| | | | |
|---|---|---|---|
| 2012/0319080 A1* | 12/2012 | Fudeta | H01L 33/025 257/13 |
| 2013/0082237 A1* | 4/2013 | Northrup | H01L 33/32 257/13 |
| 2013/0099141 A1* | 4/2013 | Chua | H01L 33/007 250/504 R |
| 2015/0060908 A1 | 3/2015 | Jain et al. | |
| 2016/0111596 A1 | 4/2016 | Kim et al. | |
| 2016/0225950 A1 | 8/2016 | Han et al. | |
| 2016/0268477 A1 | 9/2016 | Fujita et al. | |
| 2018/0019375 A1 | 1/2018 | Fujita et al. | |
| 2018/0083173 A1 | 3/2018 | Yamamoto et al. | |
| 2018/0261725 A1 | 9/2018 | Kaneda et al. | |
| 2018/0287014 A1* | 10/2018 | Asada | H01L 33/145 |
| 2019/0103509 A1 | 4/2019 | Lachab | |
| 2021/0391502 A1 | 12/2021 | Watanabe | |

FOREIGN PATENT DOCUMENTS

| | | |
|---|---|---|
| JP | 5641173 B2 | 12/2014 |
| JP | 2016-149544 A | 8/2016 |
| JP | 2016-171127 A | 9/2016 |
| JP | 2018-049949 A | 3/2018 |
| JP | 2018-124529 A | 8/2018 |
| JP | 2018-532265 A | 11/2018 |
| JP | 2020-77874 A | 5/2020 |
| WO | WO 2012/012010 A2 | 1/2012 |
| WO | 2016/125492 A1 | 8/2016 |
| WO | 2017/013729 A1 | 1/2017 |
| WO | WO 2017/057149 A1 | 4/2017 |
| WO | WO 2019/054068 A1 | 3/2019 |

\* cited by examiner

NITRIDE SEMICONDUCTOR LIGHT-EMITTING ELEMENT

CROSS-REFERENCE TO RELATED APPLICATION

The present application is based on Japanese Patent Application No. 2019-144676 filed on Aug. 6, 2019, the entire contents of which are incorporated herein by reference.

BACKGROUND OF THE INVENTION

1. Field of the Invention

The invention relates to a nitride semiconductor light-emitting element.

2. Related Art

In recent years, nitride semiconductor light-emitting elements, such as light-emitting diodes or laser diodes, which emit ultraviolet light have been put into practical use, and nitride semiconductor light-emitting elements capable of producing enhanced emission output have been under development (see, e.g., Japanese Patent No. 564H73).

The light-emitting element described in Japanese Patent No. 5641173 has a multiple-quantum well layer formed on a group III nitride single crystal and composed of barrier layers and well layers. The thickness of the final barrier layer, which is one of the barrier layers and is located on the p-type group III nitride layer side, is adjusted to 2 nm to 10 nm and the thickness of each of the well layers is adjusted to not more than 2 nm.

Patent Document 1: Japanese Patent No. 5641173

However, even when measures to optimize the film thicknesses of the final barrier layer and the well layers are taken as are done for the light-emitting element described in Japanese Patent No. 5641173, sufficient emission intensity is not achieved in some cases and there is a room for further improvement to increase emission intensity.

THE SUMMARY OF THE INVENTION

Therefore, it is an object of the invention to provide a nitride semiconductor light-emitting element which can produce enhanced emission output.

According to one aspect of the present invention, a nitride semiconductor light-emitting element, comprises:

an active layer comprising an AlGaN-based barrier layer;

a p-type contact layer located on an upper side of the active layer; and an electron blocking stack body located between the active layer and the p-type contact layer, wherein the electron blocking stack body comprises a first electron blocking layer and a second electron blocking layer, the first electron blocking layer being located on the active layer side and having a higher Al composition ratio than an Al composition ratio in the barrier layer, and the second electron blocking layer being located on the p-type contact layer side and having a lower Al composition ratio than an Al composition ratio in the barrier layer, Points of the Invention According to the present invention, it is possible to provide a nitride semiconductor light-emitting element which can produce enhanced emission output.

BRIEF DESCRIPTION OF THE DRAWINGS

Next, the present invention will be explained in more detail in conjunction with appended drawings, wherein.

DESCRIPTION OF THE PREFERRED EMBODIMENTS

Figure 3:
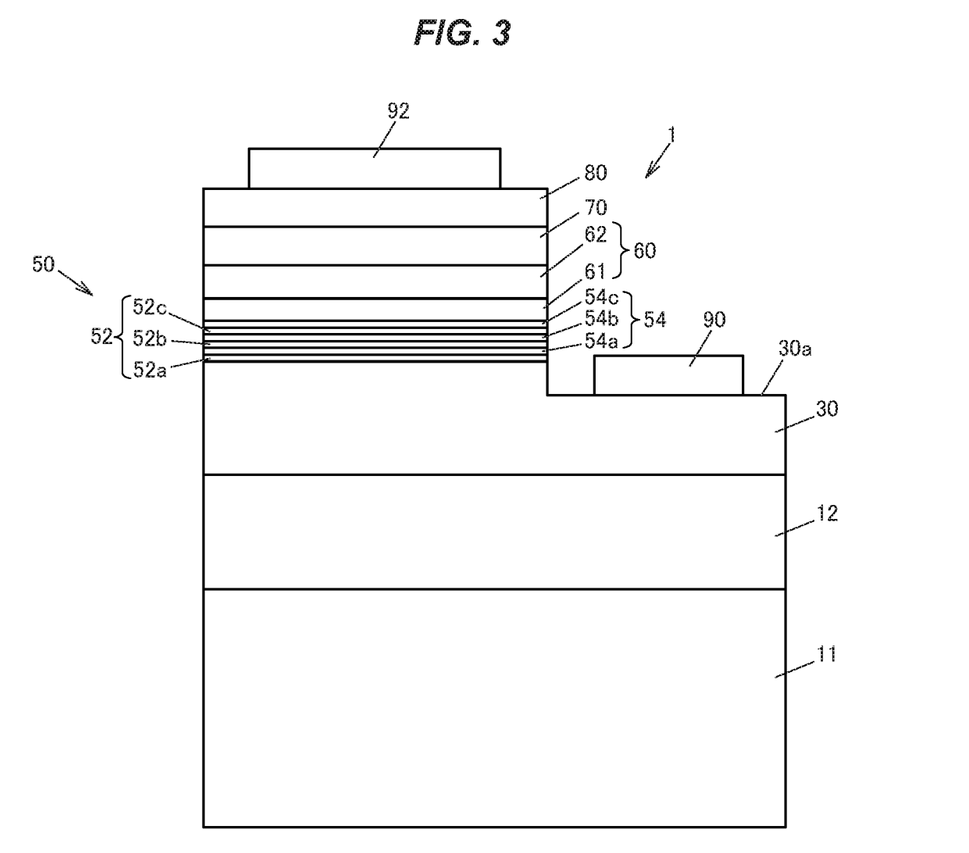
FIG. 3 is a schematic cross-sectional view showing an exemplary configuration of the nitride semiconductor light-emitting element in the second embodiment of the invention.

Embodiments of the invention will be described in reference to the drawings. The embodiments below are described as preferred examples for implementing the invention. Although some part of the embodiments specifically illustrates various technically preferable matters, the technical scope of the invention is not limited to such specific aspects. In addition, a scale ratio of each constituent element in FIGS. 1 and 3 is not necessarily the same as the actual scale ratio of the nitride semiconductor light-emitting element.

First Embodiment

Configuration of Nitride Semiconductor Light-Emitting Element

Figure 1:
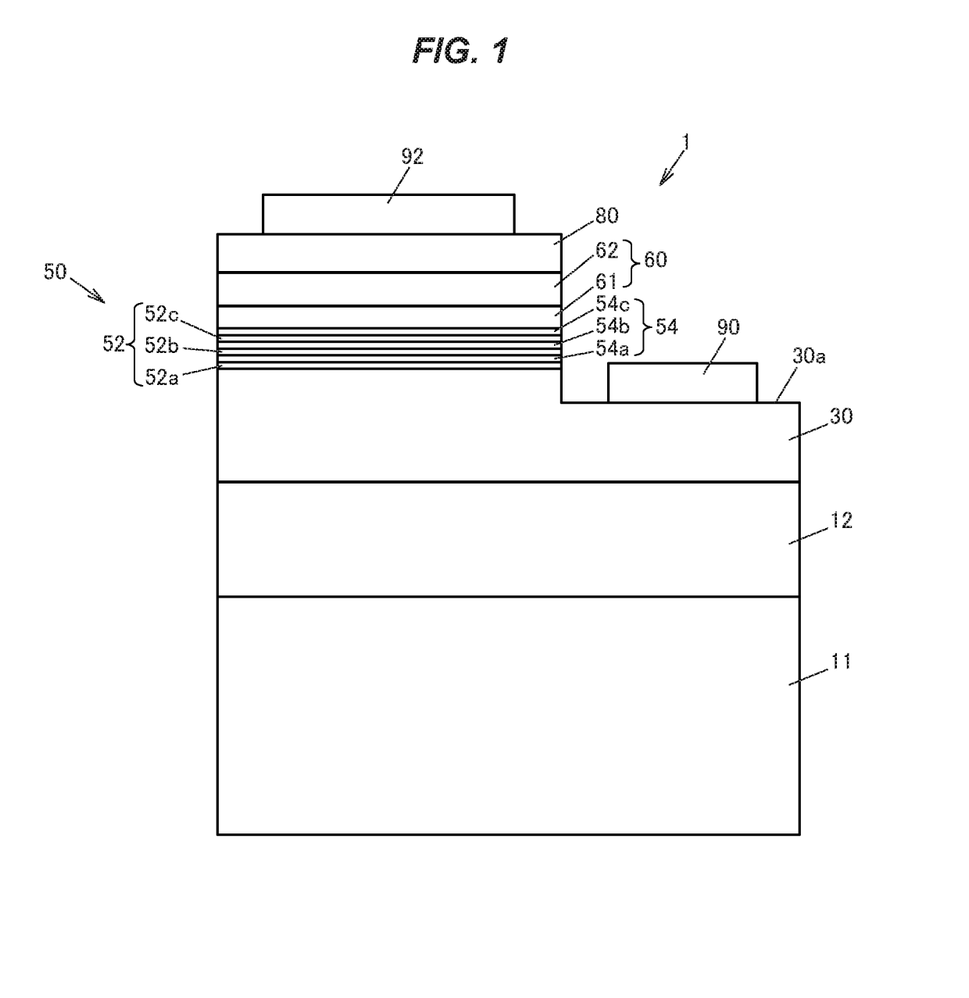
FIG. 1 is a schematic cross-sectional view showing an exemplary configuration of a nitride semiconductor light-emitting element in the first embodiment of the present invention.
Figure 2:
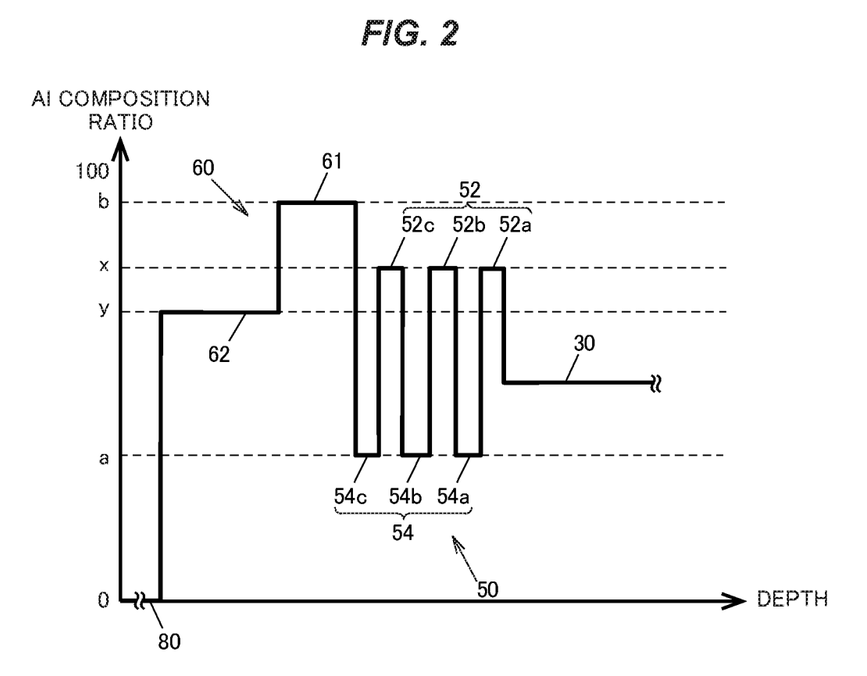
FIG. 2 is a schematic diagram illustrating an example of an Al composition ratio in a semiconductor layer constituting the nitride semiconductor light-emitting element in the first embodiment of the invention.

FIG. 1 is a schematic cross-sectional view showing an exemplary configuration of a nitride semiconductor light-emitting element in the first embodiment of the invention. FIG. 2 is a schematic diagram illustrating an example of an Al composition ratio (also called "AlN mole fraction") in a semiconductor layer constituting the nitride semiconductor light-emitting element shown in FIG. 1. A nitride semiconductor light-emitting element 1 (hereinafter, also simply referred to as "light-emitting element r") includes, e.g., laser diode or light-emitting diode (LED). In the first embodiment, a light-emitting diode (LED) which emits ultraviolet light at a central wavelength of 250 nm to 360 nm will be described as an example of the light-emitting element 1.

As shown in FIG. 1, the light-emitting element 1 includes a substrate 11, a buffer layer 12, an n-type cladding layer 30, an active layer 50, an electron blocking stack body 60 formed by stacking plural electron blocking layers, a p-type contact layer 80, an n-side electrode 90 and a p-side electrode 92.

The active layer 50 has three barrier layers 52a, 52b, 52c, including the barrier layer 52a located on the n-type cladding layer 30 side, and three well layers 54a, 54b, 54c, including the well layer 54b located on the electron blocking stack body 60 side. The electron blocking stack body 60 includes a structure in which a first electron blocking layer 61 and a second electron blocking layer 62 are stacked sequentially. In the following description, "the barrier layer 52" is used as a collective term for the three barrier layers 52a, 52b, 52c and "the well layer 54" is used as a collective term for the three well layer 54a, 54b, 54c.

The semiconductor which can be used to form the light-emitting element 1 is, e.g., a binary, ternary, or quaternary group III nitride semiconductor which is expressed by $Al_rGa_sIn_{1-r-s}N$ ($0 \leq r \leq 1$, $0 \leq s \leq 1$, $0 \leq r+s \leq 1$,). In addition, the group III elements thereof may be partially substituted with boron (B) or thallium (Tl), etc., and N may be partially substituted with phosphorus (P), arsenic (As), antimony (Sb) or bismuth (Bi), etc. Each constituent element will be described below.

(1) Substrate 11

The substrate 11 is a substrate transparent to ultraviolet light emitted from the light-emitting element 1. For example, a sapphire substrate formed of sapphire ($Al_2O_3$) is used as the substrate 11. Alternatively, the substrate H may be an AlN single crystal substrate formed of aluminum nitride (AlN).

(2) Buffer Layer 12

The buffer layer 12 is formed on the substrate 11. The buffer layer 12 is an AlN layer formed of AlN. The buffer layer 12 has a thickness of about 1.0 µm to 4.5 µm. The buffer layer 12 may have a single layer or a multilayer structure. When the substrate 11 is an AlN single crystal substrate, the buffer layer 12 may not necessarily be provided. An undoped AlGaN layer formed of AlGaN may be provided on the buffer layer 12.

(3) N-Type Cladding Layer 30

The n-type cladding layer 30 is formed on the buffer layer 12. The n-type cladding layer 30 is a layer formed of n-type AlGaN and is, e.g., an AlGaN layer doped with silicon (Si) as an n-type impurity. Alternatively, germanium (Ge), selenium (Se) or tellurium (Fe), etc., may be used as the n-type impurity. The n-type cladding layer 30 has a thickness of about 1 µm to 4 µm and is, e.g., about 2 µm to 3 µm in thickness.

In addition, the Al composition ratio in the n-type AlGaN constituting the n-type cladding layer 30 is higher than the Al composition ratio in AlGaN constituting the well layers. This is to suppress a decrease in light extraction efficiency due to absorption of light from the active layer 50 by the n-type cladding layer 30 in a configuration in which the light-emitting element 1 is flip-chip mounted, i.e., in a configuration in which the light emitted from the active layer 50 is extracted on the n-type cladding layer 30 side. The n-type cladding layer 30 may have a single layer or a multilayer structure.

(4) Active Layer 50

The active layer 50 is formed on the n-type cladding layer 30. In the present embodiment, the active layer 50 has a quantum well structure in which the three barrier layers 52a, 52b, 52c and the three well layers 54a, 54b, 54c are stacked alternately.

The barrier layer 52 has a thickness in a range of, e.g., about 3 nm to 50 nm. The well layer 54 has a thickness in a range of, e.g., about 1 nm to 5 nm. The numbers of the barrier layers 52 and the well layers 54 are not limited to three, and may be respectively one, two, or four or more. The configuration with one each of the barrier layer 52 and the well layer 54 is also called a single quantum well (SQW) structure, and the configuration with plural barrier layers 52 and well layers 54 is also called a multi-quantum well (MQW) structure.

As shown in FIG. 2, the barrier layer 52 includes $Al_xGa_{1-x}N$ and the well layer 54 includes $Al_aGa_{1-a}N$ ($0 \leq x \leq 1$, $0 \leq a \leq 1$, $a < x$). Here, x is the Al composition ratio in AlGaN constituting the barrier layer 52 (hereinafter, also referred to as "the Al composition ratio in the barrier layer 52"), and a is the Al composition ratio in AlGaN constituting the well layer 54 (hereinafter, also referred to as "the Al composition ratio in the well layer 54").

In addition, each of the Al composition ratio x in the barrier layer 52 and the Al composition ratio a in the well layer 54 is appropriately adjusted so that a band gap in the active layer 50 is not less than 3.4 eV and can output ultraviolet light at a wavelength of not more than 360 nm.

(5) Electron Blocking Stack Body 60

The electron blocking stack body 60 is formed on the active layer 50. The electron blocking stack body 60 is a layer serving to prevent the outflow of electrons toward the p-type contact layer 80. The electron blocking stack body 60 includes a structure composed of the first electron blocking layer 61 located on the active layer 50 side and the second electron blocking layer 62 staked on the first electron blocking layer 61.

Both the first electron blocking layer 61 and the second electron blocking layer 62 are layers formed of p-type AlGaN and are, e.g., AlGaN layers doped with magnesium (Mg) as a p-type impurity. Alternatively, zinc (Zn), beryllium (Be), calcium (Ca), strontium (Sr), barium (Ba) or carbon (C) etc., may be used as the p-type impurity. The first electron blocking layer 61 may alternatively be undoped.

In detail, the first electron blocking layer 61 includes $Al_bGa_{1-b}N$ and the second electron blocking layer 62 includes $Al_yGa_{1-y}N$ ($0 \leq b \leq 1$, $0 \leq y \leq 1$). Here, b is the Al composition ratio in the p-type AlGaN constituting the first electron blocking layer 61 (hereinafter, also referred to as "the Al composition ratio in the first electron blocking layer 61"), and y is the Al composition ratio in the p-type AlGaN constituting the second electron blocking layer 62 (hereinafter, also referred to as "the Al composition ratio in the second electron blocking layer 62"). If the second electron blocking layer 62 having a lower Al composition ratio is arranged on the active layer 50 side relative to the first electron blocking layer 61, the existence probability of electrons overflowing to the position of the first electron blocking layer 61 having a higher Al composition ratio is increased. Thus, the existence probability of electrons in the well layer 54 is reduced and luminous efficiency decreases by the amount of such reduction. Based on this, to improve the existence probability of electrons in the well layer 54 and enhance luminous efficiency, the first electron blocking layer 61 having a higher Al composition ratio is provided on the active layer 50 side.

As shown in FIG. 2, the Al composition ratio y in the second electron blocking layer 62 is lower than the Al composition ratio b in the first electron blocking layer 61 (y<b). By forming the electron blocking stack body 60 from plural layers including the first electron blocking layer 61 and the second electron blocking layer 62 and adjusting the Al composition ratio b in the first electron blocking layer 61 to higher than the second electron blocking layer 62, it is possible to improve the above-described function of the electron blocking stack body 60, i.e., the function of suppressing the outflow of electrons toward the p-type contact layer 80.

In addition, since the Al composition ratio y in the second electron blocking layer 62 is lower than the first electron blocking layer 61, it is possible to suppress an increase in resistance which could occur when the entire electron blocking stack body 60 has a high Al composition ratio. In other words, by forming the electron blocking stack body 60 from two layers with different Al composition ratios and adjusting the Al composition ratios and thicknesses of the two layers, it is possible to achieve both prevention of the outflow of electrons and suppression of the increase in resistance.

In addition, by configuring the Al composition ratio y in the second electron blocking layer 62 to be lower than a certain value (lower than the Al composition ratio b in the first electron blocking layer 61 as an example) as described above, it is possible to suppress a decrease in luminous efficiency which could occur when it is difficult to dope with an impurity such as Mg due to high Al composition ratio.

In addition, as shown in FIG. 2, the Al composition ratio b in the first electron blocking layer 61 is higher than the Al composition ratio x in the barrier layer 52 (i.e., x<b). The Al composition ratio y in the second electron blocking layer 62 is lower than the Al composition ratio x in the barrier layer 52 (i.e., and is higher than the Al composition ratio a in the well layer 54 (i.e., a<y). In other words, the Al composition ratios a b, x and y satisfy the relation of a<y<x<b. A specific example of the Al composition ratios a, b, x and y is shown in Table 1 below.

TABLE 1

Al composition ratios

| Layer | Al composition ratio | Range |
| --- | --- | --- |
| First electron blocking layer 61 | b | Not less than 80% (not more than 100%) |
| Barrier layer 52 | x | Not less than 45% and not more than 95% |
| Second electron blocking layer 62 | y | Not less than 40% and not more than 90% |
| Well layer 54 | a | Not less than 0% and not more than 55% |

The thickness of the second electron blocking layer 62 is larger than the thickness of the first electron blocking layer 61. The thickness of the second electron blocking layer 62 is, e.g., not less than not less than 5 times and not more than 20 times the thickness of the first electron blocking layer 61. As an example, the first electron blocking layer 61 has a thickness of not less than 1 nm and not more than 10 nm and the second electron blocking layer 62 has a thickness of not less than 5 nm and not more than 100 nm.

The electron blocking layer when having a higher Al composition ratio or a larger thickness can have the more improved function of suppressing the outflow of electrons, but electrical resistance of the light-emitting element 1 may increase when the thickness of the high Al composition ratio layer is increased. However, in the configuration in which the thickness of the second electron blocking layer 62 having a lower Al composition ratio is lamer than the thickness of the first electron blocking layer 61 having a higher Al composition ratio, the entire electron blocking stack body 60 can have not less than a certain thickness while reducing the thickness of the first electron blocking layer 61 having a higher Al composition ratio. Therefore, by configuring that the thickness of the second electron blocking layer 62 is larger than the thickness of the first electron blocking layer 61, it is possible to improve the function of suppressing the outflow of electrons while suppressing an increase in electrical resistance of the electron blocking stack body 60.

(6) P-Type Contact Layer 80

The p-type contact layer 80 is formed on the electron blocking stack body 60, in particular, on the second electron blocking layer 62. The p-type contact layer 80 is a layer which is, e.g., doped with a high concentration of impurity such as Mg and is formed of, p-type AlGaN having an Al composition ratio of not more than 10%. Preferably, the p-type contact layer 80 is a p-type GaN layer formed of p-type GaN.

(7) N-Side Electrode 90

The n-side electrode 90 is formed on a certain region of the n-type cladding layer 30. The n-side electrode 90 is formed of, e.g., a multilayered film formed by sequentially stacking titanium (Ti), aluminum (Al), Ti, and gold (Au) in this order (Ti/Al/Ti/Au) on the n-type cladding layer 30.

(8) P-Side Electrode 92

The p-side electrode 92 is formed on the p-type contact layer 80. The p-side electrode 92 is formed of, e.g., a multilayered film formed by sequentially stacking nickel (Ni) and gold (Au) on the p-type contact layer 80.

Method for Manufacturing Light-Emitting Element 1

Next, a method for manufacturing the light-emitting element 1 will be described. Firstly, the buffer layer 12 is grown on the substrate 11 at high temperature. Next, the n-type cladding layer 30, the active layer 50, the electron blocking stack body 60 and the p-type contact layer 80 are sequentially stacked on the buffer layer 12, thereby forming a circular plate-shaped nitride semiconductor stacked body (also called "wafer") with a predetermined diameter (e.g., about 50 mm).

The n-type cladding layer 30, the active layer 50, the electron blocking stack body 60 and the p-type contact layer 80 may be formed by a well-known epitaxial growth method such as Metal Organic Chemical Vapor Deposition (MOCVD) method, Molecular Beam Epitaxy (MBE) method, or Hydride Vapor Phase Epitaxy (HYPE) method.

Next, a mask is formed on the p-type contact layer 80. Then, the active layer 50, the electron blocking stack body 60 and the p-type contact layer 80 are removed in the exposed region in which the mask is not formed. The active layer 50, the electron blocking stack body 60 and the p-type contact layer 80 may be removed by, e.g., plasma etching.

The n-side electrode 90 is formed on an exposed surface 30a of the n-type cladding layer 30 (see FIG. 1), and the p-side electrode 92 is formed on the p-type contact layer 80 after removing the mask. The n-side electrode 90 and the p-side electrode 92 may be formed by, e.g., a well-known method such as electron beam evaporation method or sputtering method. The light-emitting element 1 shown in FIG. 1 is obtained by cutting this wafer into pieces with a predetermined dimension.

Second Embodiment

Figure 4:
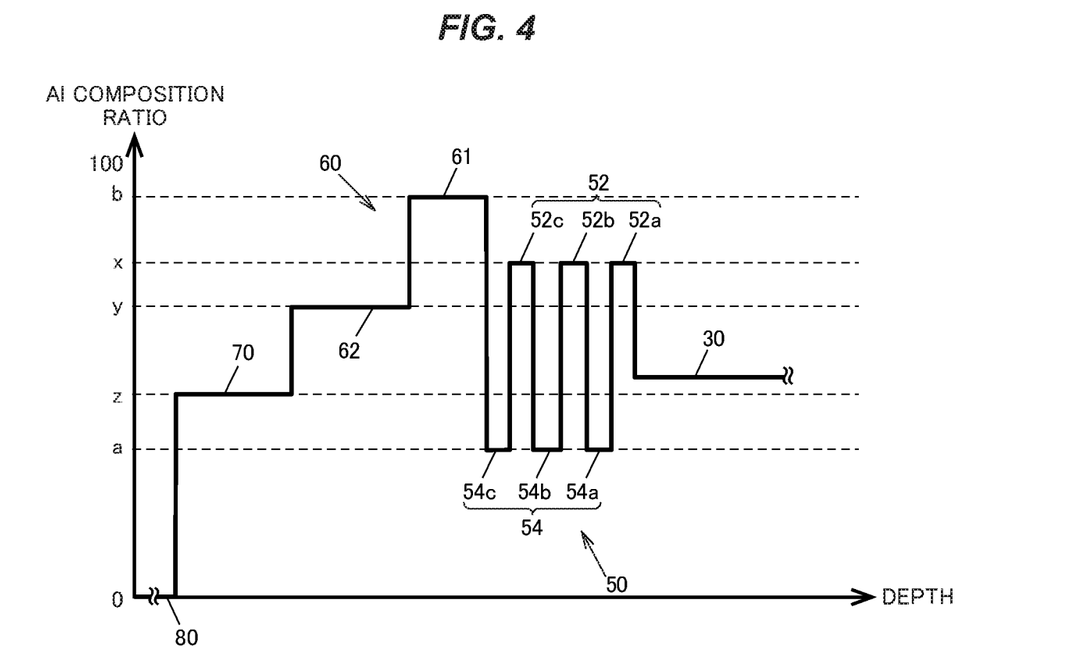
FIG. 4 is a schematic diagram illustrating an example of the Al composition ratio in a semiconductor layer constituting the nitride semiconductor light-emitting element in the second embodiment of the invention.

FIG. 3 is a schematic cross-sectional view showing an exemplary configuration of the light-emitting element 1 in the second embodiment of the invention. FIG. 4 is a schematic diagram illustrating an example of the Al composition ratio in a semiconductor layer constituting the light-emitting element 1 shown in FIG. 3. The light-emitting element 1 in the second embodiment is different from the light-emitting element 1 in the first embodiment in having a p-type cladding layer 70. Next, the difference from the first embodiment will be mainly described.

The light-emitting element 1 in the second embodiment has the configuration of the light-emitting element 1 in the first embodiment described above and is further provided with the p-type cladding layer 70 located between the electron blocking stack body 60 and the p-type contact layer 80. The p-type cladding layer 70 has a thickness of about 10 nm to 1000 nm and is, e.g., about 20 nm to 800 nm in thickness. The p-type cladding layer 70 is a layer formed of p-type AlGaN.

In detail, the p-type cladding layer 70 includes $Al_zGa_{1-z}N$ (0≤z≤1). Here, z is an Al composition ratio in the p-type AlGaN constituting the p-type cladding layer 70 (hereinafter, also referred to as "the Al composition ratio in the p-type cladding layer 70").

As shown in FIG. 4, the Al composition ratio z in the p-type cladding layer 70 is not more than the Al composition ratio y in the second electron blocking layer 62 (i.e., z≤y) and is also higher than the Al composition ratio a in the well layer 54 (i.e., a≤z). In other words, the Al composition ratios a, b, x, y and z satisfy the relation of a<z≤y<x<b. As an example, the Al composition ratio z in the p-type cladding layer 70 is not less than 0% and not more than 70%.

By further providing the p-type cladding layer 70 having the Al composition ratio z which is lower than the Al composition ratio y in the second electron blocking layer 62, it is possible to further enhance the function of suppressing an increase in resistance which could occur when the Al composition ratio is high.

Third Embodiment

Figure 5:
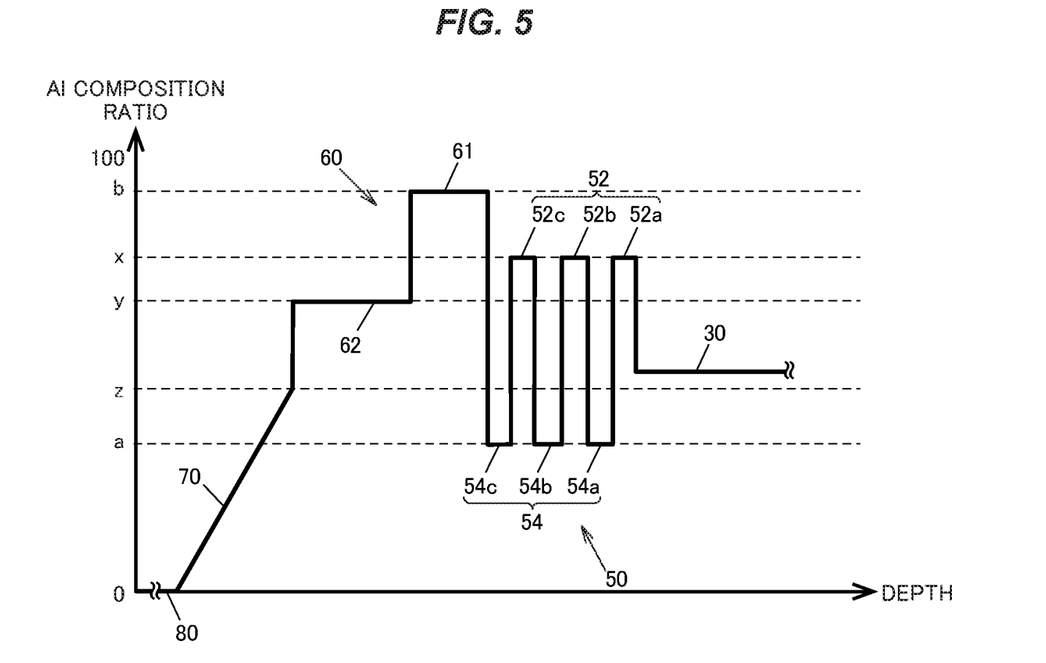
FIG. 5 is a schematic diagram illustrating an example of the Al composition ratio in a semiconductor layer constituting the nitride semiconductor light-emitting element in the third embodiment of the invention.

FIG. 5 is a schematic diagram illustrating an example of the Al composition ratio in a semiconductor layer constituting the light-emitting element 1 in the third embodiment. The light-emitting element 1 in the third embodiment is different from the light-emitting element 1 in the first embodiment in having the p-type cladding layer 70 of which Al composition ratio has a gradient in the thickness direction. Next, the difference from the first embodiment will be mainly described. Since the light-emitting element 1 in the third embodiment has substantially the same configuration as the light-emitting element 1 in the second embodiment shown in FIG. 3, the detailed explanation thereof will be omitted.

The light-emitting element 1 in the third embodiment has the configuration of the light-emitting element 1 in the first embodiment described above and is further provided with the p-type cladding layer 70 located between the electron blocking stack body 60 and the p-type contact layer 80. The Al composition ratio z in the p-type cladding layer 70 decreases toward the p-type contact layer 80. The gradient of the Al composition ratio z (a rate of decrease in a direction toward the p-type contact layer 80) is not less than 0.025/nm and not more than 0.20/nm (i.e., not less than 2.5%/nm and not more than 20%/nm).

Decrease of the Al composition ratio z in the p-type cladding layer 70 may not necessarily be linear as shown in FIG. 5, and may be, e.g., in a stepwise shape or in a curved shape (e.g., a quadratic curve or a exponential curve, etc.). When the Al composition ratio z in the p-type cladding layer 70 decreases in a curved shape, it is preferable that the rate of decrease of the Al composition ratio become smaller toward the p-type contact layer 80 so that the Al composition ratio z can smoothly continue to the Al composition ratio in the p-type contact layer 80.

In case that the Al composition ratio has a gradient, the relation between the Al composition ratios described above (i.e., a<z≤y<x<b) is established when the Al composition ratio z in the p-type cladding layer 70 has a maximum value. The maximum value of the Al composition ratio z in the p-type cladding layer 70 here is the Al composition ratio in the p-type cladding layer 70 on the second electron blocking layer 62 side. In other words, the minimum value of the Al composition ratio in the p-type cladding layer 70 (i.e., the Al composition ratio in the p-type cladding layer 70 on the p-type contact layer 80 side) may be lower than the Al composition ratio a in the well layer. The Al composition ratio z in the p-type cladding layer 70 may be discontinuous from the second electron blocking layer 62 (z<y), Since the difference between the Al composition ratio in the p-type contact layer 80 and the Al composition ratio in the p-type cladding layer 70 is reduced by configuring the Al composition ratio z in the p-type cladding layer 70 to have a gradient in the thickness direction as described above, it is considered that dislocation occurring at a discontinuous portion of the Al composition ratio due to lattice mismatch can be further suppressed.

Emission Output

Figure 6:
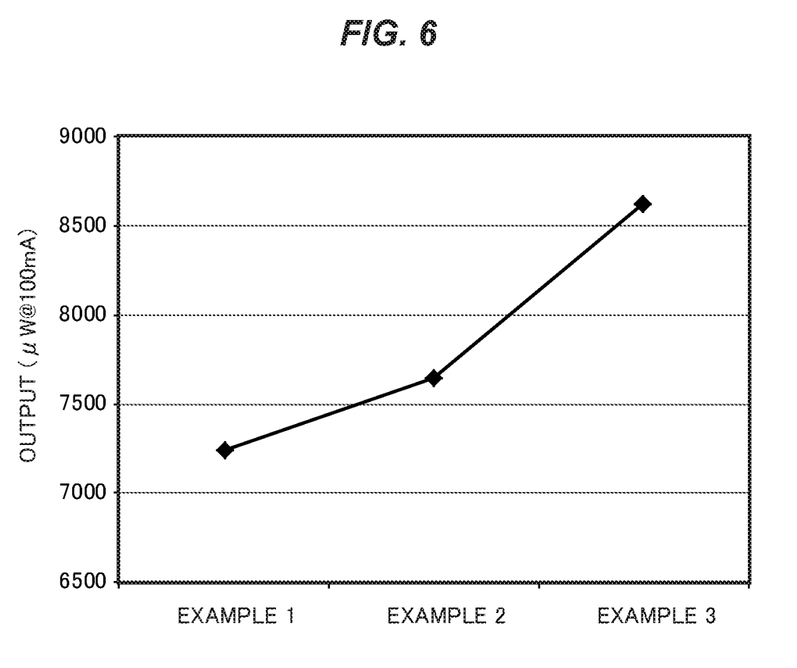
FIG. 6 is a diagram illustrating an example of measurement results of emission outputs of the nitride semiconductor light-emitting elements in the embodiments of the invention.

FIG. 6 is a diagram illustrating an example of measurement results of emission outputs of the light-emitting elements 1 in the embodiments described above. "Example 1." On the horizontal axis shows the measurement result of the light-emitting element 1 in the first embodiment, "Example 2" shows the measurement result of the light-emitting element 1 in the second embodiment, and "Example 3" shows the measurement result of the light-emitting element 1 in the third embodiment. The emission output can be measured by various known methods. In this Example, as an example, a certain current (e.g., 100 mA) was supplied between the n-side electrode 90 and the p-side electrode 92 which are described above, and emission output was measured by a photodetector placed under the light-emitting element 1.

As shown in FIG. 6, in Example 1, emission output at a central wavelength of 279 nm was $7.2 \times 10^3$ μW. Then, in Example 2, emission output at a central wavelength of 275 nm was $7.6 \times 10^3$ μW. Furthermore, in Example 3, emission output at a central wavelength of 282 nm was $8.6 \times 10^3$ μW. The measurement results confirmed that emission output is further improved by providing the p-type cladding layer 70 having the Al composition ratio z lower than the Al composition ratio y in the second electron blocking layer 62 or the p-type cladding layer 70 having the gradient Al composition ratio z.

Summary of the Embodiments

Technical ideas understood from the embodiments will be described below citing the reference numerals, etc., used for the embodiments. However, each reference numeral, etc., described below is not intended to limit the constituent elements in the claims to the members, etc., specifically described in the embodiments.

[1] A nitride semiconductor light-emitting element (1), comprising: an active layer (50) comprising an AlGaN-based barrier layer (52); a p-type contact layer (80) located on an upper side of the active layer (50); and an electron blocking stack body (60) located between the active layer (50) and the p-type contact layer (80), wherein the electron blocking stack body (60) comprises a first electron blocking layer (61) and a second electron blocking layer (62), the first electron blocking layer (61) being located on the active layer (50) side and having a higher Al composition ratio than an Al composition ratio in the barrier layer (52), and the second electron blocking layer (62) being located on the p-type contact layer (80) side and having a lower Al composition ratio than an Al composition ratio in the barrier layer (52).

[2] The nitride semiconductor light-emitting element (1) described in [1], wherein the active layer (50) further comprises a well layer (54) having a lower Al composition ratio than the Al composition ratio in the barrier layer (52), and the Al composition ratio in the second electron blocking layer (62) is higher than the Al composition ratio in the well layer (54).

[3] The nitride semiconductor light-emitting element (1) described in [1] or [2], wherein the thickness of the second electron blocking layer (62) is larger than that of the first electron blocking layer (61).

[4] The nitride semiconductor light-emitting element (1) described in [3], wherein the thickness of the second electron blocking layer (62) is not less than 5 times and not more than 20 times the thickness of the first electron blocking layer (61).

[5] The nitride semiconductor light-emitting element (1) described in any one of [1] to [4], further comprising: a p-type cladding layer (70) that is located between the second electron blocking layer (62) and the p-type contact layer (80) and comprises p-type AlGaN having an Al composition ratio lower than the Al composition ratio in the second electron blocking layer (62) and higher than the Al composition ratio in the well layer (54).

[6] The nitride semiconductor light-emitting element (1) described in [5], wherein the p-type cladding layer (70) has an Al composition ratio that has a gradient in the thickness direction.

[7] The nitride semiconductor light-emitting element (1) described in any one of [1] to [6], wherein the Al composition ratio in the first electron blocking layer (61) is not less than 80%, and the Al composition ratio in the second electron blocking layer (62) is not less than 40% and not more than 90%.

What is claimed is:

1. A nitride semiconductor light-emitting element, comprising:
    an active layer comprising an AlGaN-based barrier layer;
    a p-type contact layer located on an upper side of the active layer; and
    an electron blocking stack body located between the active layer and the p-type contact layer,
    the electron blocking stack body comprising a first electron blocking layer and a second electron blocking layer, the second electron blocking layer being a single layer, the first electron blocking layer being located on the active layer side and having a higher Al composition ratio than an Al composition ratio in the barrier layer, and the second electron blocking layer being located on the p-type contact layer side and having a lower Al composition ratio than an Al composition ratio in the barrier layer, a thickness of the second electron blocking layer being not less than 5 times and not more than 20 times a thickness of the first electron blocking layer.

2. The nitride semiconductor light-emitting element according to claim 1, wherein the active layer further comprises a well layer having a lower Al composition ratio than the Al composition ratio in the barrier layer, and the Al composition ratio in the second electron blocking layer is higher than the Al composition ratio in the well layer.

3. The nitride semiconductor light-emitting element according to claim 1, further comprising:
    a p-type cladding layer that is located between the second electron blocking layer and the p-type contact layer and comprises p-type AlGaN having an Al composition ratio lower than the Al composition ratio in the second electron blocking layer and higher than the Al composition ratio in the well layer.

4. The nitride semiconductor light-emitting element according to claim 3, wherein the p-type cladding layer has an Al composition ratio that has a gradient in the thickness direction.

5. The nitride semiconductor light-emitting element according to claim 1, wherein the Al composition ratio in the first electron blocking layer is not less than 80%, and the Al composition ratio in the second electron blocking layer is not less than 40% and not more than 90%.

* * * * *